United States Patent
Adan

(10) Patent No.: US 7,136,764 B2
(45) Date of Patent: Nov. 14, 2006

(54) VARIABLE GAIN AMPLIFIER CIRCUIT

(75) Inventor: Alberto O. Adan, Ikoma (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 11/159,343

(22) Filed: Jun. 23, 2005

(65) Prior Publication Data

US 2005/0285679 A1    Dec. 29, 2005

(30) Foreign Application Priority Data

Jun. 24, 2004    (JP)    ............... 2004-186905

(51) Int. Cl.
*G01R 25/00* (2006.01)
*G01R 27/00* (2006.01)

(52) U.S. Cl. ...................................... 702/65

(58) Field of Classification Search .................. 702/65, 702/109

See application file for complete search history.

(56) References Cited

U.S. PATENT DOCUMENTS

| 6,175,279 B1 | 1/2001 | Ciccarelli et al. ........... 330/296 |
| 6,566,963 B1 * | 5/2003 | Yan et al. ................. 330/311 |
| 6,600,371 B1 | 7/2003 | Cali .......................... 330/254 |

FOREIGN PATENT DOCUMENTS

JP    2006-013810    *   1/2006

OTHER PUBLICATIONS

R.G. Meyer et al., "A 2.5-GHz BiCMOS Transceiver for Wireless LAN's", IEEE Journal of Solid-State Circuits, vol. 32, No. 12, pp. 2097-2104, Dec. 1997.

C.D. Hull et al., "A Direct-Conversion Receiver for 900 MHz (ISM Band) Spread-Spectrum Digital Cordless Telephone", IEEE Journal of Solid-State Circuits, vol. 31, No. 12, pp. 1955-1963, Dec. 1996.

* cited by examiner

*Primary Examiner*—Michael Nghiem
(74) *Attorney, Agent, or Firm*—Harness, Dickey & Pierce, P.L.C.

(57) ABSTRACT

A variable gain amplifier circuit 1 includes an amplifier A1, an amplifier A2, an inductor L1, and an inductor L2. The amplifier A1 has a predetermined gain and is connected at a terminal to a circuit output section. The amplifier A2 has a different gain from the amplifier A1 and is connected at a terminal to the circuit output section. The inductor L1 is connected at an end to a circuit input section and at the other end to the input terminal of the amplifier A1. The inductor L2 is connected at an end to ground and at the other end to the input terminal of the amplifier A2. The inductors L1 and L2 form a transformer T. The configuration restricts input impedance variations which are dependent on the signal path taken by an input signal Vin. The input impedance and the signal source impedance remain matched. Impedance matching is preformed with the signal source with variable gain.

11 Claims, 11 Drawing Sheets

VARIABLE GAIN AMPLIFIER CIRCUIT

This Nonprovisional application claims priority under 35 U.S.C. § 119(a) on Patent Application No. 2004-186905 filed in Japan on Jun. 24, 2004, the entire contents of which are hereby incorporated by reference.

FIELD OF THE INVENTION

The present invention relates to variable gain amplifier circuits which allow for a variable gain setting.

BACKGROUND OF THE INVENTION

Wireless receivers are in popular use for data communications in, for example, the 2.4 GHz and 5 GHz bands in compliance with the IEEE 802.11a, IEEE 802.11b, and IEEE 802.11g standards. Mobile phones provide good examples. The wireless receiver amplifies an incoming wireless signal with an amplifier circuit tuned to a predetermined wireless frequency. The amplifier circuit in the wireless receiver is typically capable of receiving weak signals of about −90 dBm.

The incoming signal has a strength which is variable with the distance between the receiver and the transmitter where the signal originates. For example, if the transmitter is located close to the receiver, the signal level as received on the antenna is about −5 dBm. The necessary input signal can become weaker than unwanted signals in nearby channels.

The amplifier circuit is required to provide a flat signal characteristics profile and high linearity over a wide range of input signal frequencies. Specifically, the amplifier circuit desirably amplifies low level input signals (−90 dBm to −60 dBm) at high gain with low noise and high level input signals (−60 dBm or higher) at high gain and high linearity.

Generally, these requirements are met by a variable gain amplifier circuit which allows for a variable gain setting. Receivers incorporating a variable gain amplifier circuit detect input signal strength and automatically change the gain of the variable gain amplifier circuit.

Conventional variable gain amplifier circuit come in various forms which will be now described in reference to FIG. 11 to FIG. 17.

U.S. Pat. No. 6,600,371 (published Jul. 29, 2003) discloses the conventional circuit shown in FIG. 11. The illustrated circuit is a quad amplifier containing four transistors Q112, Q113, Q112', and Q113'. The four transistors amplify signals from major signal paths while controlling gains. A gain setting is made through control voltage.

FIG. 12 shows an exemplary conventional circuit. The illustrated conventional circuit is a wireless signal transmitter/receiver. The circuit provides a Gilbert cascode stage containing an input transistor Q121 with an emitter feedback as well as transistors Q122 and Q123. The Gilbert cascode stage processes signals either to or from the output section Vout. This means that the Gilbert cascode stage controls the amount of signal traversing from input Vin to output Vout, by adjusting the controlling voltages Vc1 and Vc2.

U.S. Pat. No. 6,566,963 (published May 20, 2003) discloses the circuit shown in FIG. 13. The conventional circuit has two amplifier stages. Specifically, in the conventional circuit, the first amplifier stage involving a transistor Q131 connects to the second amplifier stage (transistors Q132, Q133, and Q134) via a transformer 131.

FIG. 14 shows another conventional circuit example. The illustrated conventional circuit has two signal paths. A first signal path consists of transistors Q141, Q142, and Q143 an has high gain. A second signal path consists of Q144 and has low gain and high linearity in signal conversion. Along the first signal path, the gain can be varied by the transistors Q142, Q143. As to the second signal path, the transistor Q144 is a common base configuration. The resistor R141 helps to improve the linearity of the transistor Q144.

The conventional circuit shown in FIG. 15 is disclosed in "A 2.5-GHz BiCMOS transceiver for wireless LAN's" by R. G. Meyer et al., IEEE Journal of Solid-State Circuits, Vol. 32, No. 12, pp. 2097–2104, December 1997. Like the one in FIG. 14, this conventional circuit has two signal paths. A first signal path consists of a transistor Q154 and has high gain. A second signal path consists of transistors Q151, M152 and has low gain. Both transistors Q151, M152 act as an emitter follower. When the first signal path is used to amplify an input signal, the transistor Q154 acts on the signal. On the other hand, when the second signal path is used to amplify an input signal, the transistors Q151, M152 act on the signal; the transistor Q154 is turned off.

The conventional circuit shown in FIG. 16 is disclosed in "A direct-conversion receiver for 900 MHz (ISM Band) spread-spectrum digital cordless telephone" by C. D. Hull et al., IEEE Journal of Solid-State Circuits, Vol. 31, No. 1a2, pp. 1955–1963, December 1996. Like the one in FIG. 12, the illustrated conventional circuit relies on transistors Q164, Q167 for variable gain. The degree of linearity of the circuit is determined by the characteristics of the transistor Q164.

The conventional circuit shown in FIG. 17 is disclosed in Published Japanese translation of PCT application 2002-506304 (Tokuhyo 2002-506304; published Feb. 26, 2002). The illustrated circuit can vary its gain because of a change of bias current Ibias to digital.

These conventional circuits however have a narrow dynamic range, variable input impedance dependent on the gain setting, and other problems.

The conventional circuit in FIG. 11 has another problem that a balanced unbalanced device (balun) is needed to couple the input signal from an antenna to the amplifier stage. Another problem is that resistor and transistor parameters among others must be altered to suit the operating wireless frequency.

The conventional circuits shown in FIGS. 12, 13, 16 shows a narrow dynamic range when the input signal has large amplitude, which can be a problem.

The FIG. 14 conventional circuit has other problems: The circuit does not show a constant input impedance when the signal paths are switched. The resistor R141 adds to the noise factor. The input signal inverts in polarity depending on the operating signal path. Concretely, in the FIG. 14 circuit, the transistor Q141 is an inverting amplifier. The input signal inverts its polarity when it passes through the transistors Q141, Q142. In contrast, the transistor Q144 is a common base configuration; the input signal does not invert its polarity when it goes through the path involving the transistor Q144.

As for the FIG. 15 conventional circuit, the input impedance does not match the signal source impedance. An external matching network is needed for the impedance matching, which adds to the component count. Another problem is found where the input signal has different polarities between the two signal paths, because the transistor Q154 is an inverting amplifier, and the transistor M152 is a non-inverting amplifier. Also, the parasitic capacitance due to the presence of the transistors M151, M152 can degrade noise factor.

In the FIG. 17 conventional circuit, the input impedance, which is a function of the bias current Ibias, is dependent on the gain setting and varies greatly. Therefore, the input impedance does not match the signal source impedance.

SUMMARY OF THE INVENTION

The present invention, conceived in view of these problems, has an objective to provide an amplifier circuit with variable gain and minimum impedance variations.

To address the problems, the variable gain amplifier circuit in accordance with the present invention includes a first amplifier, a second amplifier, a first inductor, and a second inductor. The first amplifier has a predetermined gain and is connected at a terminal to a circuit output section. The second amplifier has a different gain from the first amplifier and is connected at a terminal to the circuit output section. The first inductor is connected at an end to a circuit input section and at another end to the input terminal of the first amplifier. The second inductor is connected at an end to a fixed electrical potential (e.g. ground) and at another end to the input terminal of the second amplifier. The first inductor and the second inductor form a transformer.

According to the configuration, the input signal of the circuit feeds the transformer before feeding the first amplifier or the second amplifier. The input signal either goes through the first inductor before feeding the first amplifier or goes through the first and second inductors before feeding the second amplifier. The first inductor is magnetically coupled to the second inductor. The current regulating operation inherent to the transformer restricts variations of the ratio of the current flow through the first inductor to the current flow through the second inductor. The circuit thereby restricts variations of input impedance which are dependent on the signal path taken by the input signal. Impedance matching with the signal source is maintained.

Additional objects, advantages and novel features of the invention will be set forth in part in the description which follows, and in part will become apparent to those skilled in the art upon examination of the following or may be learned by practice of the invention.

DESCRIPTION OF THE EMBODIMENTS

An embodiment of the present invention will be described in reference to FIG. 1 through FIG. 10.

Figure 2:
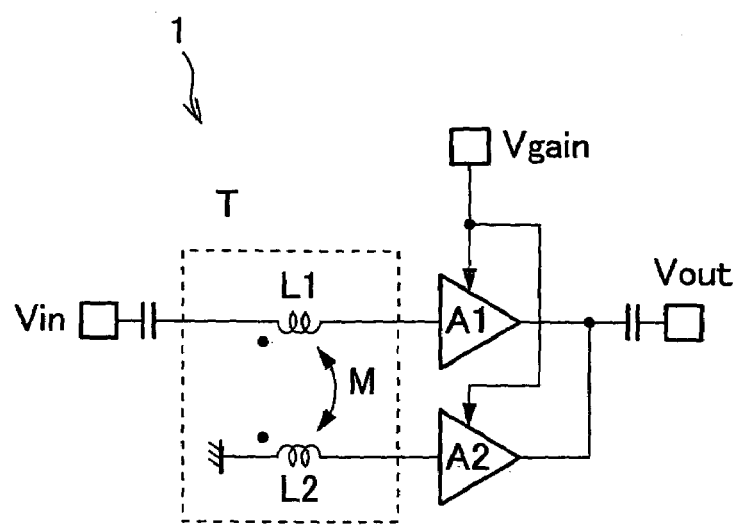
FIG. 2 is a circuit diagram illustrating a structure representing the basic principles of a variable gain amplifier circuit in accordance with an embodiment of the present invention.

First, referring to FIG. 2 will be described the basic principles of a variable gain amplifier circuit 1 in accordance with the present invention. FIG. 2 is a circuit diagram illustrating a structure representing the basic principles of the variable gain amplifier circuit 1 in accordance with an embodiment of the present invention. According to the figure, the variable gain amplifier circuit 1 in accordance with the present invention is primarily made of an amplifier (first amplifier) A1, another amplifier (second amplifier) A2, and a transformer T. The transformer T contains an inductor (first inductor) L1 and another inductor (second inductor) L2. An end of the inductor L1 is connected to a circuit input section of the variable gain amplifier circuit 1; the other end is connected to the input terminal of the amplifier A1. An end of the inductor L2 is grounded: the other end is connected to the input terminal of the amplifier A2. The remaining terminals of the amplifiers A1, A2 are connected to a circuit output section of the variable gain amplifier circuit 1.

The amplifier A1 has a predetermined gain. In contrast, the amplifier A2 has a different gain from that of the amplifier A1. In the variable gain amplifier circuit 1, the amplifier A1 has a larger gain than the amplifier A2. In FIG. 2, the points (dots) by the inductors L1, L2 show polarity.

The variable gain amplifier circuit 1, structured as above, has two signal paths. A first signal path includes the inductor L1 and the amplifier A1. A second path includes the transformer T (i.e., inductors L1, L2) and the amplifier A2. The first signal path, or high gain path, has more gain and less noise than the second signal path. The second signal path, or low gain path, has less gain and shows better linearity in signal amplification than the first high gain path.

The variable gain amplifier circuit 1 is supplied with an input signal Vin from a signal source. The input signal Vin passes through either the high or low gain path depending on the signal amplitude. The selection of the path is determined by control signal Vgain. The signal Vin is amplified along the path and appears as an output signal Vout. If going through the high gain path, the input signal Vin is amplified by the amplifier A1: if going through the low gain path, the signal Vin is amplified by the amplifier A2.

Figure 3:
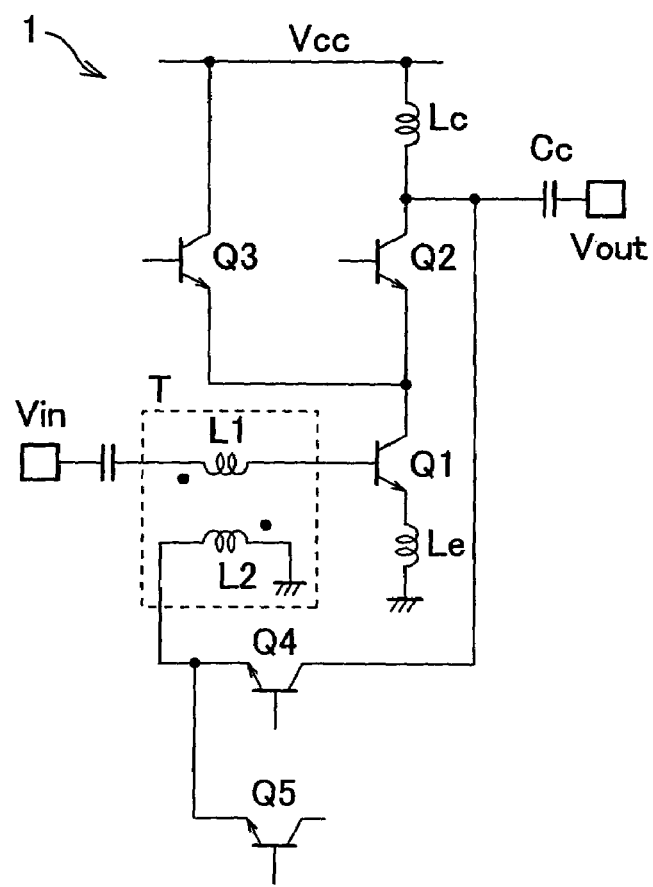
FIG. 3 is a circuit diagram illustrating a variable gain amplifier circuit in more detail in accordance with an embodiment of the present invention.

The actual configuration of the variable gain amplifier circuit 1 will be now specifically described in reference to FIG. 3. FIG. 3 is a circuit diagram illustrating the variable gain amplifier circuit 1 in more detail in accordance with an embodiment of the present invention. According to the figure, the high gain path (first signal path) includes the transistors Q1, Q2, Q3. The low gain path (second signal path) includes the transistors Q4, Q5. The transistors Q2, Q3 along the high gain path are cascode connected. This cascode connection prevents output signal leak through the base-collector stray capacitance. The transistors Q4, Q5 along the low gain path are identical in electrical characteristics including amplification factor.

In the variable gain amplifier circuit 1, the behavior of the transistors Q4, Q5 changes depending on the path through which the input signal Vin passes. The transistors Q4, Q5 are provided along the low gain path and have the same characteristics. Specifically, when the input signal Vin travels through the high gain path, the transistor Q4 is off, and the transistor Q5 is on. On the other hand, when the input signal Vin travels through the low gain path, the transistor Q4 is on, and the transistor Q5 is off.

In the variable gain amplifier circuit 1 configured as above, the inductor L2 is always connected to either of the transistors sharing the same characteristics (transistors Q4, Q5), no matter which signal path is taken by the signal.

Figure 1:
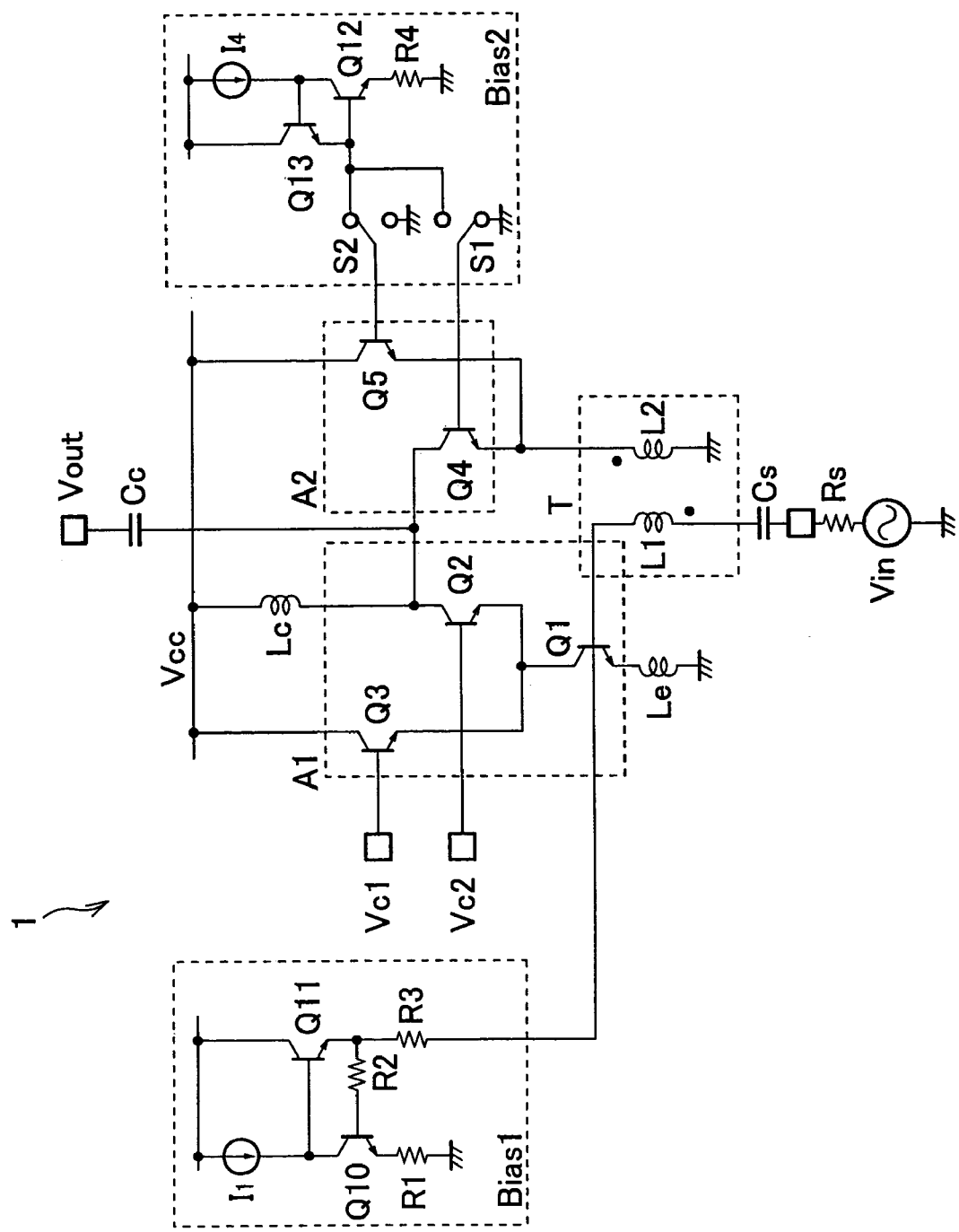
FIG. 1, related to an embodiment of the present invention, is a circuit diagram illustrating the structure of a variable gain amplifier circuit in detail.

Now referring to FIG. 1, the configuration of the variable gain amplifier circuit 1 will be specifically described in more detail. FIG. 1 is a circuit diagram illustrating the structure of the variable gain amplifier circuit 1 in detail in accordance with an embodiment of the present invention. According to the figure, the variable gain amplifier circuit 1 is configured from the transistors Q1 to Q5, the transformer T, a capacitor Cs, another capacitor Cc, an inductor Lc, another inductor Le, a bias circuit Bias1, and another bias circuit Bias2. The transformer T includes the first inductor L1 and the second inductor L2, In this variable gain amplifier circuit 1, a signal input end of the inductor L1 in the transformer T is connected to a signal source via the capacitor Cs. The other end of the inductor L1 is connected to the base of the transistor Q1. Also connected to the base of the transistor Q1 is the output section of the bias circuit Bias1. The emitter of the transistor Q1 is grounded via the inductor Le, and the collector is connected to the emitters of the transistors Q2, Q3.

The base of the transistor Q3 is connected to a voltage source Vc1, and the collector is connected to a voltage source Vcc. the base of the transistor Q2 is connected to the voltage source Vc2, and the collector is connected to the voltage source Vcc via the inductor Lc and also to the output section via the capacitor Cc.

An end of the inductor L2 in the transformer T is grounded, and the other end is connected to the emitters of the transistors Q4, Q5. The base of the transistor Q4 is connected to a switch S1, and the collector is connected to the output section via the capacitor Cc. The base of the transistor. Q5 is connected to a switch S2, and the collector is connected to the voltage source Vcc.

The bias circuit Bias1 is a current mirror circuit involving resistors R1 to R3 and transistors Q10, Q11. The circuit outputs a bias current I1 to the base of the transistor Q1.

The bias circuit Bias2 is another current mirror circuit involving a resistor R4 and transistors Q12, Q13. The circuit selectively outputs a current I4 to either the transistor Q4 or the transistor Q5. The selection is made through the switches S1, S2. Specifically, when the input signal Vin passes through the high gain path in the variable gain amplifier circuit 1, the switch S2 in the bias circuit Bias2 is on, and the switch S1 is off. The current I4 is supplied to the transistor Q5, turning on the transistor Q5 and turning off the transistor Q4. In contrast, when the input signal Vin passes through the low gain path, the switch S1 in the bias circuit Bias2 is on, and the switch S2 is off. The current I4 is supplied to the transistor Q4, turning on the transistor Q4 and turning off the transistor Q5.

In the variable gain amplifier circuit 1 configured as above, the inductor L2 is always connected to one of the ON transistors sharing the same characteristics (transistors Q4, Q5), no matter which signal path is taken by the input signal Vin. Therefore, current is always divided between the inductors L1, L2 at a constant ratio, which in turn retains the input impedance at a constant value. In addition, the polarity of the input signal Vin remains unchanged no matter which signal path is taken by the input signal Vin.

The following will describe a gain along the high gain path in the variable gain amplifier circuit 1.

The gain from the circuit input section up to the base of the transistor Q1 is given by equation (1):

$$\frac{v_{b1}}{v_{in}} = \frac{Z_i}{Z_i + R_s} \times \frac{Z_{in}}{Z_i} = \frac{Z_{in}}{2R_s} \qquad \text{Eq. (1)}$$

where vin is the input voltage to the circuit input section in the variable gain amplifier circuit 1, vb1 is the base voltage of the transistor Q1, Zin is the base impedance of the transistor Q1, Zi is the input impedance of the circuit input section, and Rs is the impedance of a resistor connected in series with the signal source. Equation (1) assumes that Zi and Rs are matched.

The emitter of the transistor Q1 is grounded. The transistors Q2, Q3, cascode connected to the collector of the transistor Q1, act as a load. Considering all these facts, the gain of the transistor Q1 is given by equation (2):

$$\frac{v_{e2}}{v_{b1}} = \frac{-g_{m1}}{g_{m2} + g_{m3}} \cong -1 \qquad \text{Eq. (2)}$$

where ve2 is the emitter voltage of the transistor Q2, gm1 is the transconductance of the transistor Q1, gm2 is the transconductance of the transistor Q2, and gm3 is the transconductance of the transistor Q3.

The transistor Q2 is a common base configuration. Considering this, the gain of the transistor Q2 is given by equation (3):

$$\frac{v_0}{v_{e2}} \cong g_{m2} \times Z_C \qquad \text{Eq. (3)}$$

where vo is the output voltage of the variable gain amplifier circuit 1, gm2 is the transconductance of the transistor Q2 (see above), and Zc is the collector impedance of the transistor Q2. That is, Zc represents the addition of the inductance of the inductor Lc, the capacitance of the capacitor Cc, and the load impedance RL in the next stage.

Letting a current IC1 be the current through the transistor Q1, a current IC2 be the current through the transistor Q2, and a current IC3 be the current through the transistor Q3, IC1=IC2+IC3. Considering this and from equations (1) to (3), the gain AHG along the high gain path is given by equation (4):

$$A_{HG} = \left(\frac{v_{b1}}{v_{in}}\right) \times \left(\frac{v_{e2}}{v_{b1}}\right) \times \left(\frac{v_0}{v_{e2}}\right) = \frac{-g_{m2} \times Z_{in} \times Z_C}{2 \times R_s} \quad \text{Eq. (4)}$$

Equation (4) gives a gain when the total input impedance matches Rs. In the variable gain amplifier circuit 1, gm2 is changeable through the control of the current flow through the transistor Q2. The gain along the high gain path can be changed in this manner.

The impedance Zin satisfies equation (5):

$$Z_{in} = r_b + \left(\frac{g_{m1}}{C_{\pi 1}}\right) \times L_e + j\omega L_e + \frac{1}{j\omega C_{\pi 1}}$$
$$= r_b + \omega_{T1} \times L_e + j\omega L_e + \frac{1}{j\omega C_{\pi 1}} \quad \text{Eq. (5)}$$

where rb is the base resistance of the transistor Q1, gm1 is the transconductance of the transistor Q1 (see above), Cπ1 is the base input conductance of the transistor Q1, and Le is the emitter inductance (inductor Le) of the transistor Q1.

The input impedance Zi of the signal source for the entire circuit satisfies equation (6):

$$Z_i = Z_1 + Z_{in} \quad \text{Eq. (6)}$$

where Zin is the base input impedance of the transistor Q1, and Z1 is the series impedance of the inductor L1 in the transformer T. Z1 is a function of the inductance of the inductors L1 and L2. The impedance of the inductor L1 reflects that of the inductor L2. The emitter impedance of the transistor Q5 acts as a load for the inductor L2 in the transformer T, because the transistor Q5 is on and the transistor Q4 is off when the input signal passes through the high gain path.

When equation (7) holds, the input impedance of the variable gain amplifier circuit 1 and that of the signal source are matched. In other words, the variable gain amplifier circuit 1 and the signal source are impedance matched.

$$Re(Z_i) = R_S$$
$$Im(Z_i) = 0 \quad \text{Eq. (7)}$$

where Re(Zi) and Im(Zi) are the real and imaginary parts of the input impedance Zi respectively. When equation (7) holds, signals are transferred from the signal source to the variable gain amplifier circuit 1 most efficiently. In other words, the transferred electric power of the signal is a maximum.

Now, the following will describe operation of the variable gain amplifier circuit 1 when the input signal Vin is amplified along the low gain path.

In the variable gain amplifier circuit 1, signal feeds from the voltage source Vc1 and the voltage source Vc2 are suspended when the input signal Vin has an amplitude more than or equal to a predetermined value. This turns off the transistors Q2 and Q5, deactivating the high gain path. The feed suspension is done by control means provided external to the variable gain amplifier circuit 1.

Then, the switch S1 in the bias circuit Bias2 turns on, and the switch S2 turns off. Therefore, the current through the transistor Q1 does not reach the circuit output section. In contrast, the current through the transistor Q4 does reach the circuit output section. The input signal Vin thus passes through the low gain path and appears as the output signal Vout.

In this manner, either the high gain path or the low gain path is selected in accordance with the level (amplitude) of the input signal Vin in the variable gain amplifier circuit 1. In other words, the amplification path the input signal takes is switched in accordance with the amplitude of the input signal.

The following will describe gain along the low gain path. The voltage E1 across the inductor L1 and the voltage E2 across the inductor L2 satisfy equation (8).

$$E_2 = \frac{-j\omega M}{(1 + j\omega L_2 g_{m4})} \times \frac{E_1}{Z_1} \quad \text{Eq. (8)}$$

where M is the mutual inductance of the inductors L1, L2 in the transformer T, k is the magnetic coupling coefficient of the transformer T, and gm4 is the mutual conductance of the transistor Q4. M and k satisfy equation (9):

$$M = k\sqrt{L_1 L_2} \quad \text{Eq. (9)}$$

The voltage E1 satisfies equation (10):

$$E_1 = v_{in} \times \frac{Z_1}{R_s + Z_{in} + Z_1} \quad \text{Eq. (10)}$$

Equation (11) holds in the variable gain amplifier circuit 1 when impedance is matched:

$$E_1 = v_{in} \times \frac{Z_1}{2R_s} \quad \text{Eq. (11)}$$

The emitter-to-collector voltage gain of the transistor Q4 which is a common base configuration satisfies equation (12):

$$v_0 = g_{m4} \times Z_C \times E_2 \quad \text{Eq. (12)}$$

Therefore, considering equations (8), (11), and (12), the gain ALG along the low gain path satisfies equation (13):

$$A_{LG} = \frac{-j\omega M}{(1 + j\omega L_2 g_{m4})} \times \frac{1}{2R_s} \times g_{m4} \times Z_C \quad \text{Eq. (13)}$$

If the low gain path satisfies equations (6), (7), impedance is matched.

Figure 4:
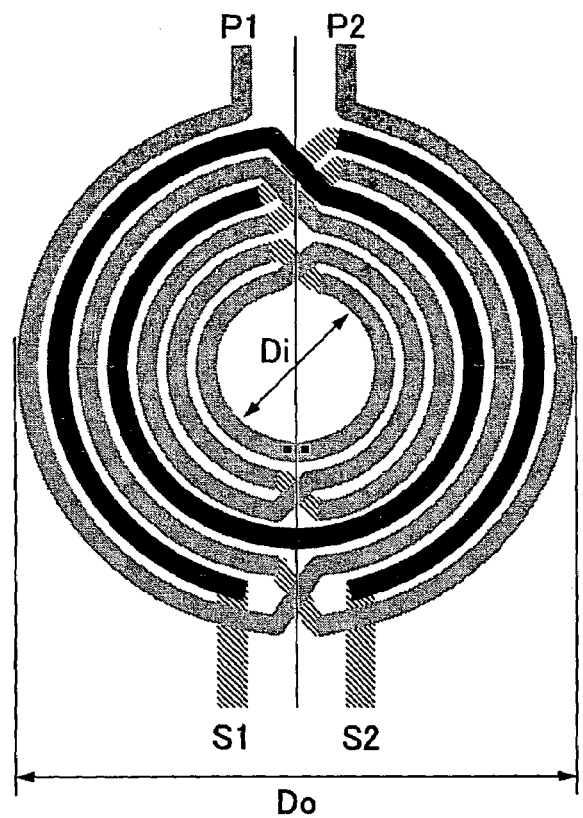
FIG. 4 is an illustration depicting a transformer structure.
Figure 5:
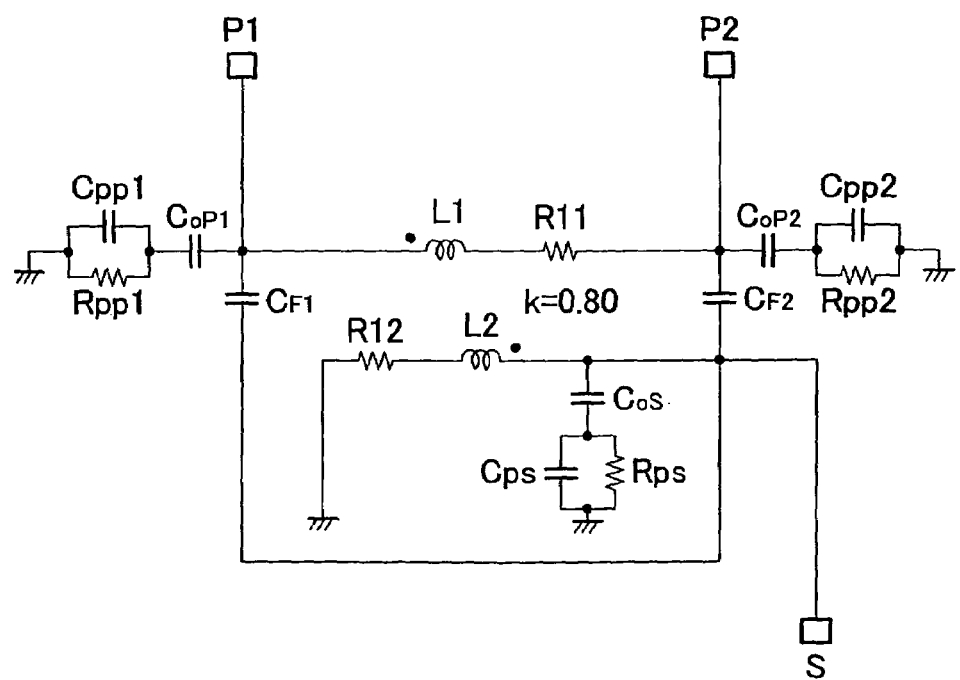
FIG. 5 is a circuit diagram illustrating a transformer configured in integrated-circuit form in detail.
Figure 6:
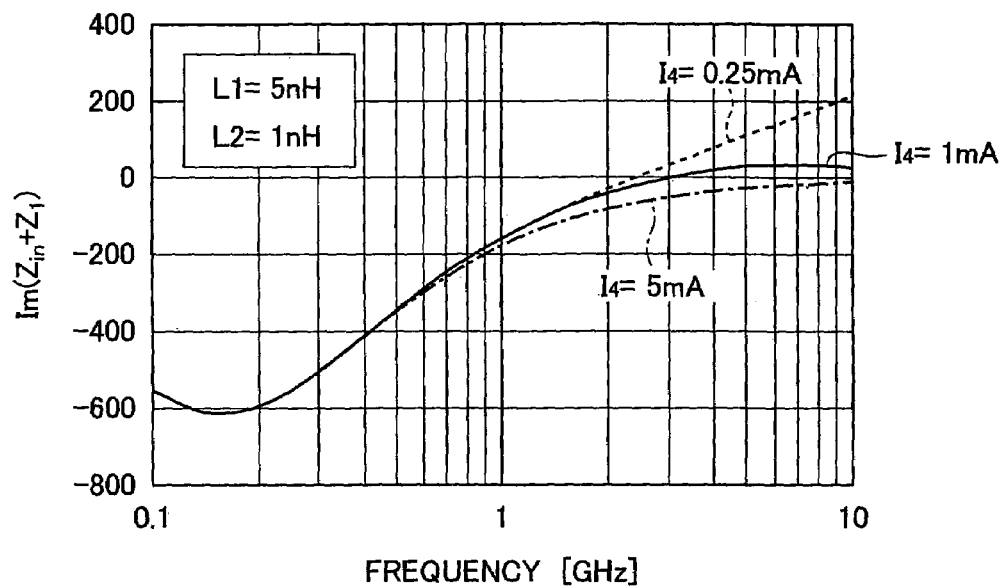
FIG. 6(a) is a graph representing relationship between frequency and the imaginary part of input impedance at different bias currents.
FIG. 6(b) is a graph representing relationship between frequency and the real part of input impedance at different bias currents.
Figure 6:
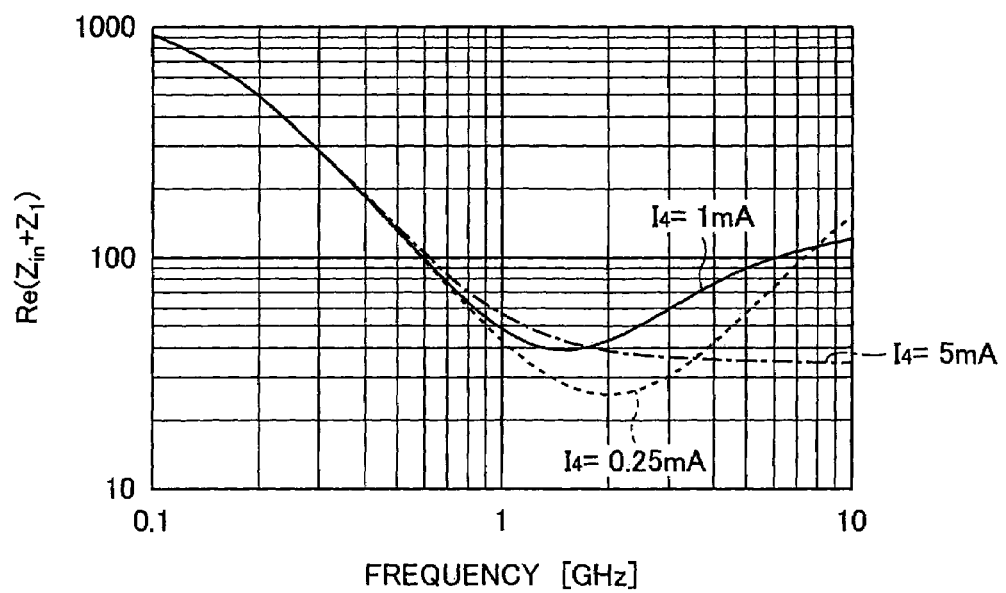

The following will describe the transformer T in the variable gain amplifier circuit 1. An example of the transformer T is shown in FIG. 4: the inductors L1 and L2 are made of copper wires wound alternately to form concentric circles. An equivalent circuit of this transformer T in integrated circuit form is shown in FIG. 5. In the FIG. 4 transformer T, the inductors L1 and L2 have a 5:2 turn ratio. In the FIG. 5 equivalent circuit, the transformer T is configured in a planar structure. Note that this transformer T is a mere example and the variable gain amplifier circuit 1 may incorporate a given transformer T.

In the variable gain amplifier circuit 1, the transformer T prevents the output signal Vout from ending up with an opposite polarity from the input signal Vin. This signal polarity adjustment is achieved specifically by reversing the winding direction of either the inductor L1 or L2, which inverts the polarity of that inductor L1 or L2. Therefore, no matter which signal path is taken, the signal polarity is not inverted and remains the same, for both paths in the variable gain amplifier circuit 1.

FIG. 6(a) is a graph representing relationship between frequency and the imaginary part of input impedance at different bias currents I4. FIG. 6(b) is a graph representing relationship between frequency and the real part of input impedance at different bias currents I4. The graphs in FIGS. 6(a) and 6(b) are drawn for an inductor L1 with a 5-nH inductance and an inductor L2 with a 1-nH inductance as examples.

The figures give impedance matching conditions in the variable gain amplifier circuit 1. Assuming that the signal source impedance Rs is 50 'Ω and the variable gain amplifier circuit 1 operates at a frequency of 2.5 GHz, the imaginary and real parts, Im(Zi) and Re(Zi), of the impedance Zi are almost nil and 60 'Ω respectively if the current I4 is 1 mA. Under these conditions, the input impedance of the variable gain amplifier circuit 1 is about 60 'Ω, which is close to the impedance of the signal source (50 'Ω). In other words, the conditions are similar to those under which the variable gain amplifier circuit 1 and the signal source are impedance matched.

Along the low gain path in the variable gain amplifier circuit 1, a switch occurs between the transistors Q4 and Q5 of the same characteristics. The switch keeps the ratio of the currents through the inductors L1 and L2 at a constant value. The inductors L1 and L2 make up the transformer T. As a result, the input impedance is constant no matter which signal path is taken. Concretely, if the high gain path is taken, the input signal Vin appears as the output signal Vout from the variable gain amplifier circuit 1 after going through three-stage amplification: the inductor L1 in the transformer T, the transistor Q1, and the transistor Q2. On the other hand, along the low gain path, the input signal Vin goes through two-stage amplification (i.e., the inductors L1, L2 in the transformer T and the transistor Q4) before appearing as the output signal Vout.

In this manner, the transformer T is connected to the signal input section in the variable gain amplifier circuit 1. Further, a set of switchable transistors sharing identical electrical characteristics (transistors Q4, Q5) are connected to the inductors L1 and L2 in the transformer T. This configuration renders the input impedance constant. This means that the input impedance for the high gain path and that for the low gain path are equal in the variable gain amplifier circuit 1. These input impedances are equal to the impedance of the signal source.

The variable gain amplifier circuit 1 hence is impedance matched no matter which signal path is taken. The noise factor, dependent on the input impedance, is rendered constant no matter which signal path is taken. The noise factor is defined as the SN (signal/noise) ratio of the input signal divided by the SN ratio of the output signal. From this definition, a low noise factor indicates a high SN ratio of the output signal. Accordingly, the variable gain amplifier circuit 1 can amplify input signals at a wide range of frequencies with variable gain and minimum noise.

Figure 7:
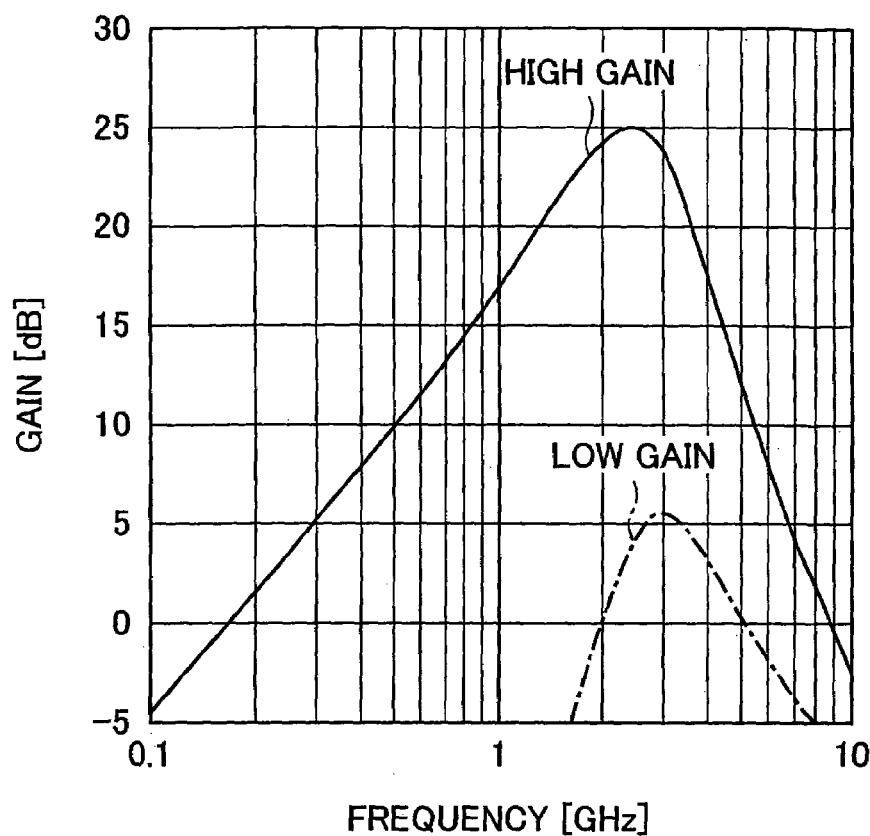
FIG. 7 is a graph representing relationship between gain and frequency of a variable gain amplifier circuit.

FIG. 7 is a graph representing relationship between gain and frequency along the high and low gain paths in the variable gain amplifier circuit 1. In the illustrated example, the variable gain amplifier circuit 1 is designed to operate at 2.4 GHz. Specifically, the high gain path is biased when the current I1=4 mA. The low gain path is biased when the current I1=1 mA. The inductor Lc has an inductance of 6 nH. The capacitor Cc has a conductance of 0.4 pF. The voltage source Vcc outputs 3 V. The collector impedance (the inductance of the inductor Lc plus the conductance of the capacitor Cc) is tuned for 2.4 GHz.

Under these conditions, the high gain path has a gain of 25 dB, and the low gain path has a gain of 5 dB in the variable gain amplifier circuit 1. The gain varies by 20 dB.

As described in the foregoing, the variable gain amplifier circuit 1, operating in a wireless frequency band, readily performs impedance matching with the signal source. The circuit 1 retains the input impedance at a constant value regardless of the gain setting. The circuit 1 reduces noise in signal amplification and controls signal polarity. The circuit 1 has a simple configuration. These are some of the advantages of the circuit 1 over conventional circuits.

The present invention may include an additional impedance matching network MN in the preceding stage to the transformer T. The example will be described in reference to FIGS. 8 and 9.

Figure 8:
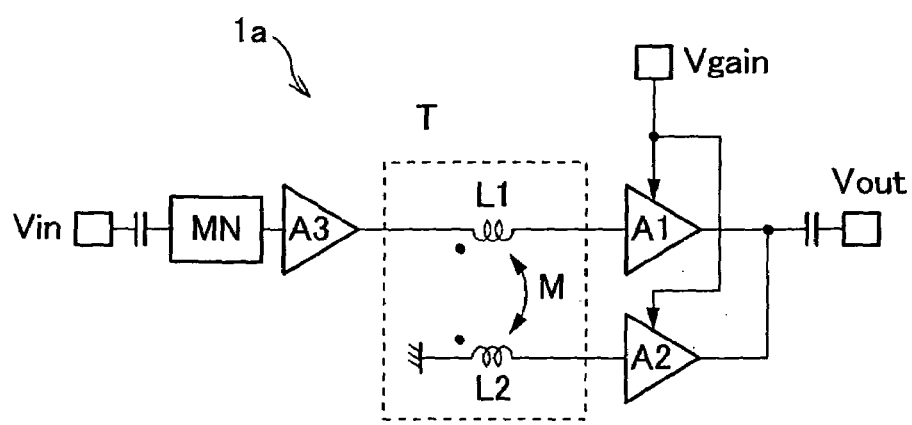
FIG. 8 is a circuit diagram illustrating basic principles of a variable gain amplifier circuit in accordance with another embodiment of the present invention.
Figure 9:
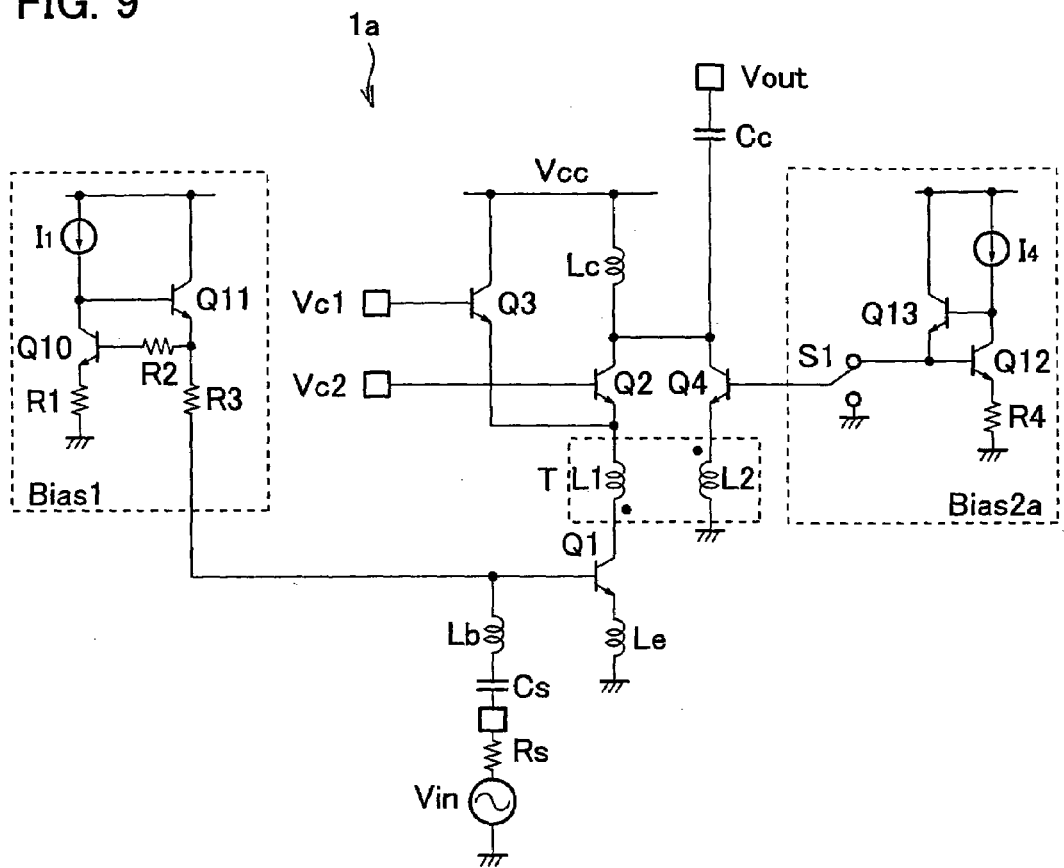
FIG. 9 is a circuit diagram illustrating the structure of a variable gain amplifier circuit in detail in accordance with another embodiment of the present invention.

FIG. 8 is a circuit diagram illustrating basic principles of a variable gain amplifier circuit 1a in accordance with another embodiment of the present invention. FIG. 9 is a circuit diagram illustrating the structure of a variable gain amplifier circuit 1a in detail in accordance with another embodiment of the present invention. Referring to FIG. 8, the variable gain amplifier circuit 1a includes an amplifier A3 and a matching network MN (collectively, a "preceding stage circuit") in the preceding stage to the transformer T. Moving on to FIG. 9, the amplifier A3 is configured from the transistor Q1. The matching network MN configured from the capacitor Cs connected in series with the signal source, an inductor Lb connected in series with the capacitor Cs, and the inductor Le.

Still referring to FIG. 9, the emitter of the transistor Q1 is grounded via the inductor Le. The base of the transistor Q1 is connected to an end of the inductor Lb. The collector of the transistor Q1 is connected to an end of the inductor L1 in the transformer T (signal input section).

A bias circuit Bias2a is a current mirror circuit feeding the transistor Q4 with the current I4. This circuit output is switched by the switch S1 between the base of the transistor Q4 and ground.

The following will describe signal paths in the variable gain amplifier circuit 1a. Like the variable gain amplifier circuit 1, the variable gain amplifier circuit 1a has two signal paths. The high gain path (amplifier A1 in FIG. 8) involves the transistors Q2, Q3, producing a high gain. In the signal path, the operation of the transistor Q3 is controlled through a voltage source Vc1, and the operation of the transistor Q2 through a voltage source Vc2. That is, the gain of the amplifier A1 is controlled through the voltage sources Vc1 and Vc2. When moving along this signal path, the input signal Vin passes through the transistor Q2 and a load impedance (inductor Lc and capacitor Cc) before feeding the output section as the output signal Vout.

The low gain path (amplifier A2 in FIG. 8) involves the transistor Q4, producing a low gain. The emitter of the transistor Q4 is connected to an end of the inductor L2. The emitter output is coupled to the output of the amplifier A1 (collector of the transistor Q1) through magnetic coupling of the inductors L1 and L2.

The two signal paths are switched by the switch S1 in the variable gain amplifier circuit 1a. When the switch S1 is on, the signal is amplified by the low gain path. On the other hand, when the switch S1 is off, the signal is amplified by the high gain path.

The transistor Q1 is always on in the variable gain amplifier circuit 1a no matter whether the switch S1 is turned on or off. Accordingly, the input impedance of the entire circuit is always constant as determined by the characteristics of the transistor Q1 no matter which signal path is taken. The noise factor, dependent on the input impedance, is also constant no matter which signal path is taken. The variable gain amplifier circuit 1a can amplify input signals at a wide range of frequencies with variable gain and minimum noise.

The present invention is by no means limited to the aforementioned circuit with two amplifiers. The invention may involve three or more amplifiers. A variable gain amplifier circuit 1b with three amplifiers will be described next.

Figure 10:
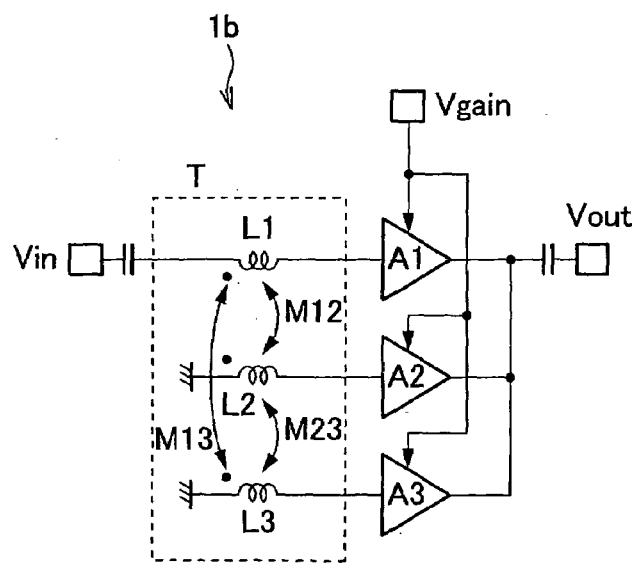
FIG. 10 is a circuit diagram illustrating basic principles of a variable gain amplifier circuit in accordance with another embodiment of the present invention.
Figure 11:
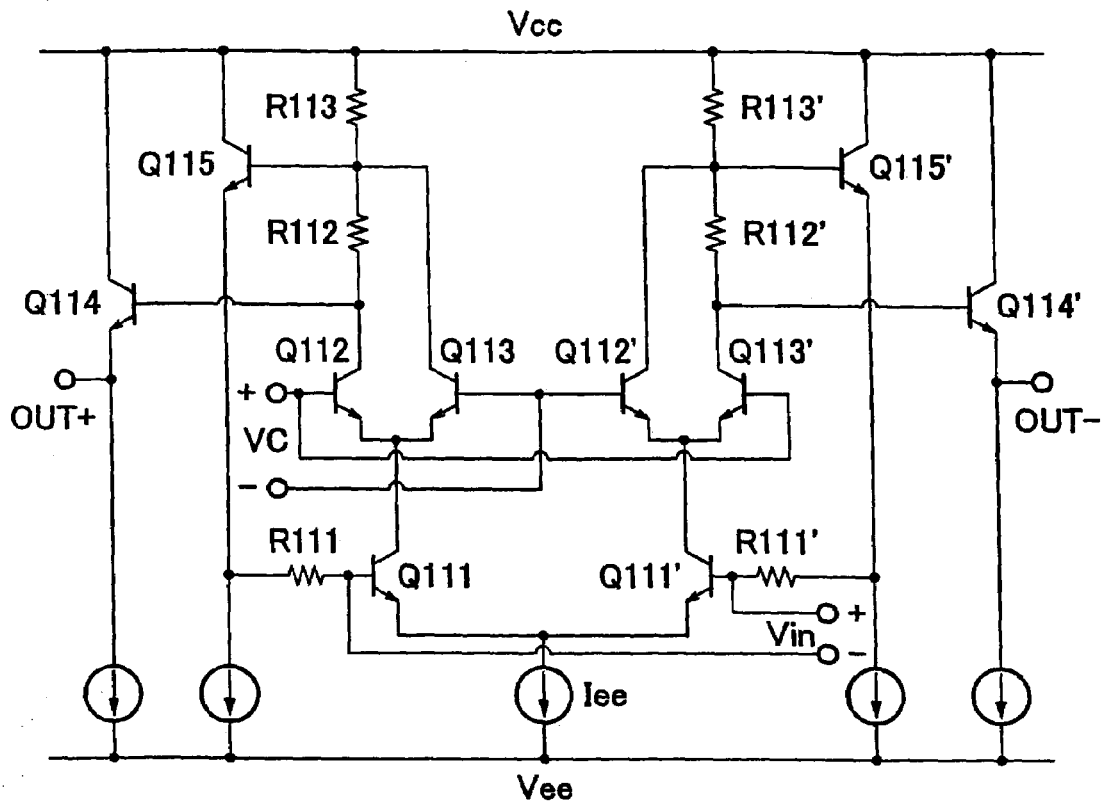
FIG. 11 is a circuit diagram illustrating the structure of a first conventional circuit.
Figure 12:
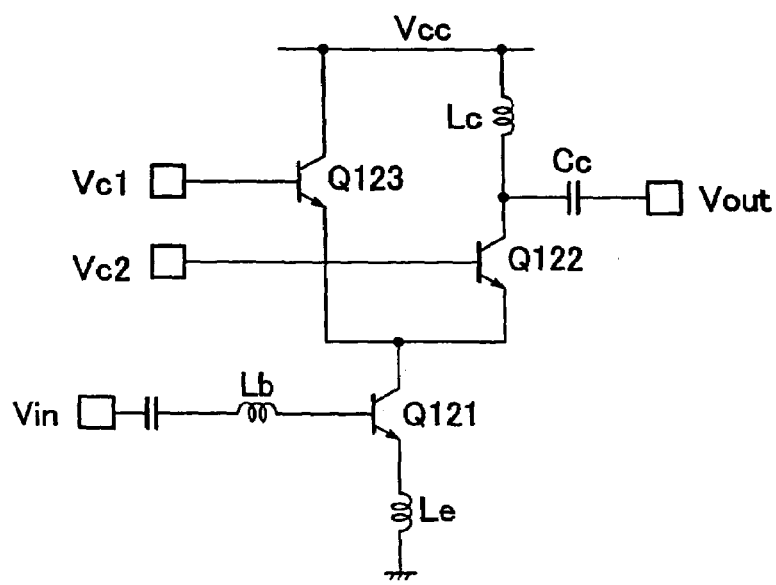
FIG. 12 is a circuit diagram illustrating the structure of a second conventional circuit.
Figure 13:
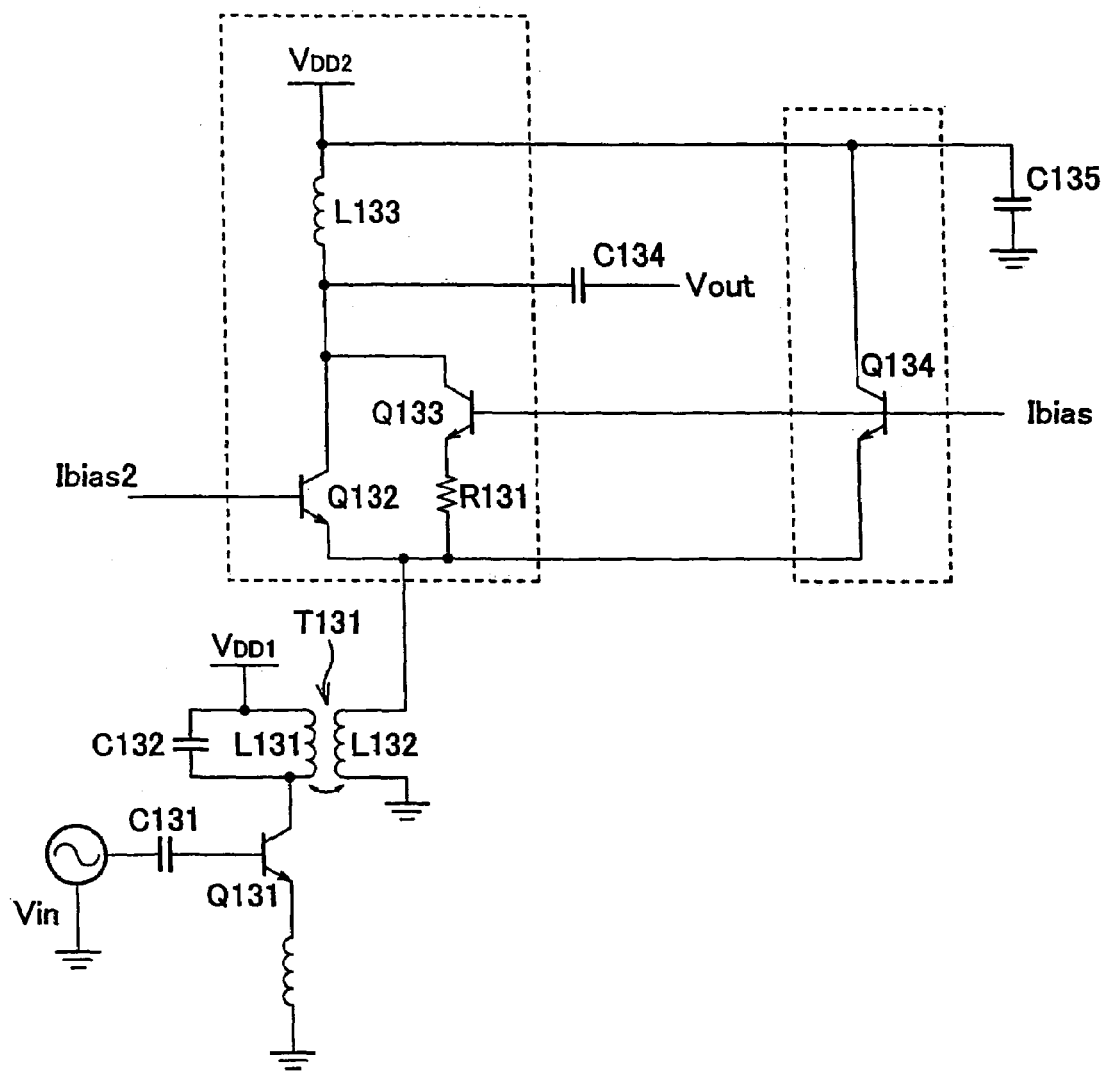
FIG. 13 is a circuit diagram illustrating the structure of a third conventional circuit.
Figure 14:
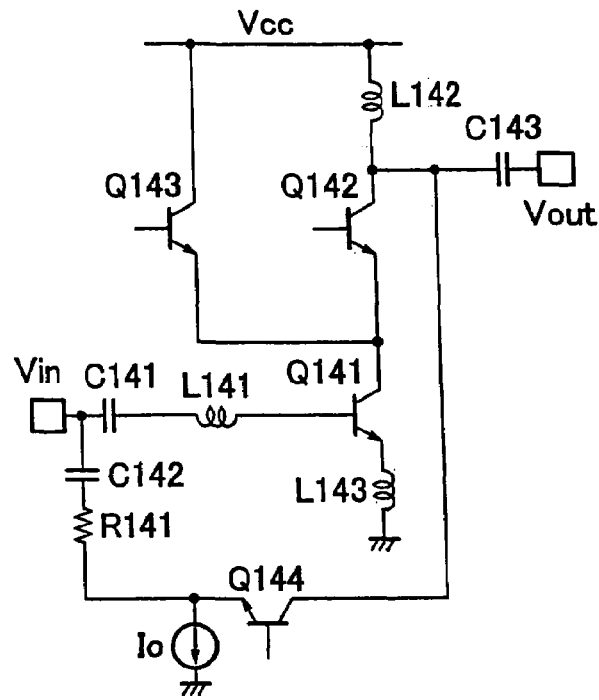
FIG. 14 is a circuit diagram illustrating the structure of a fourth conventional circuit.
Figure 15:
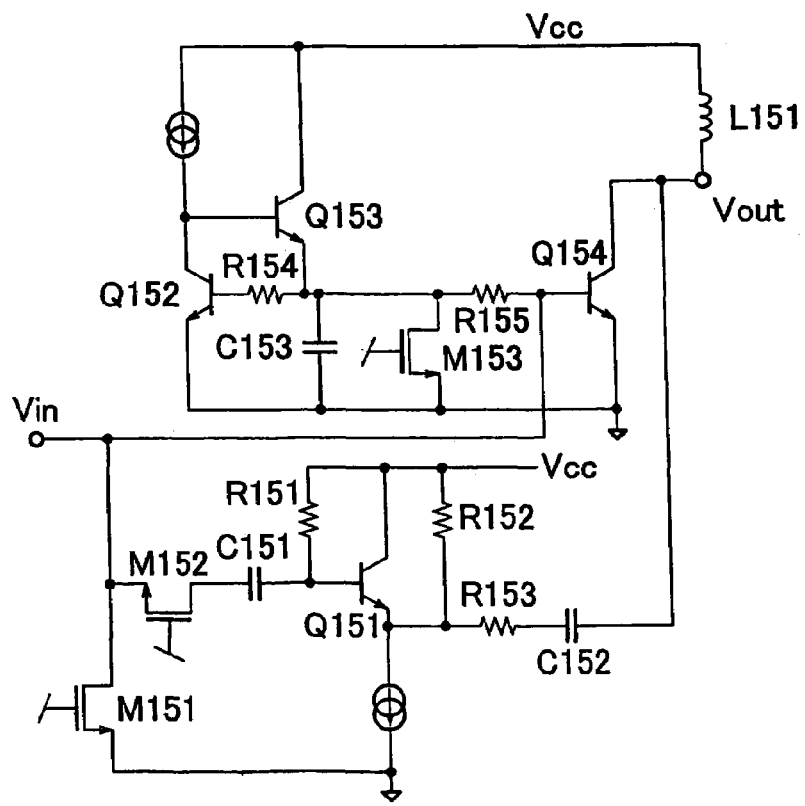
FIG. 15 is a circuit diagram illustrating the structure of a fifth conventional circuit.
Figure 16:
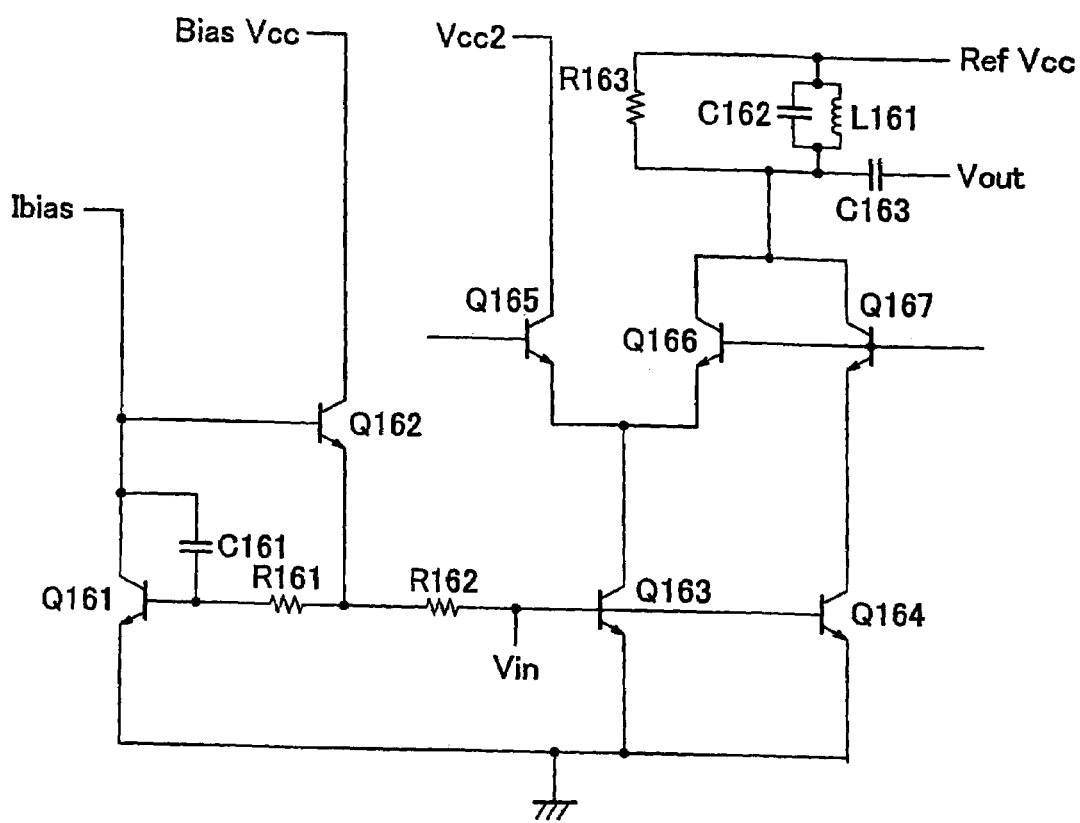
FIG. 16 is a circuit diagram illustrating the structure of a sixth conventional circuit.
Figure 17:
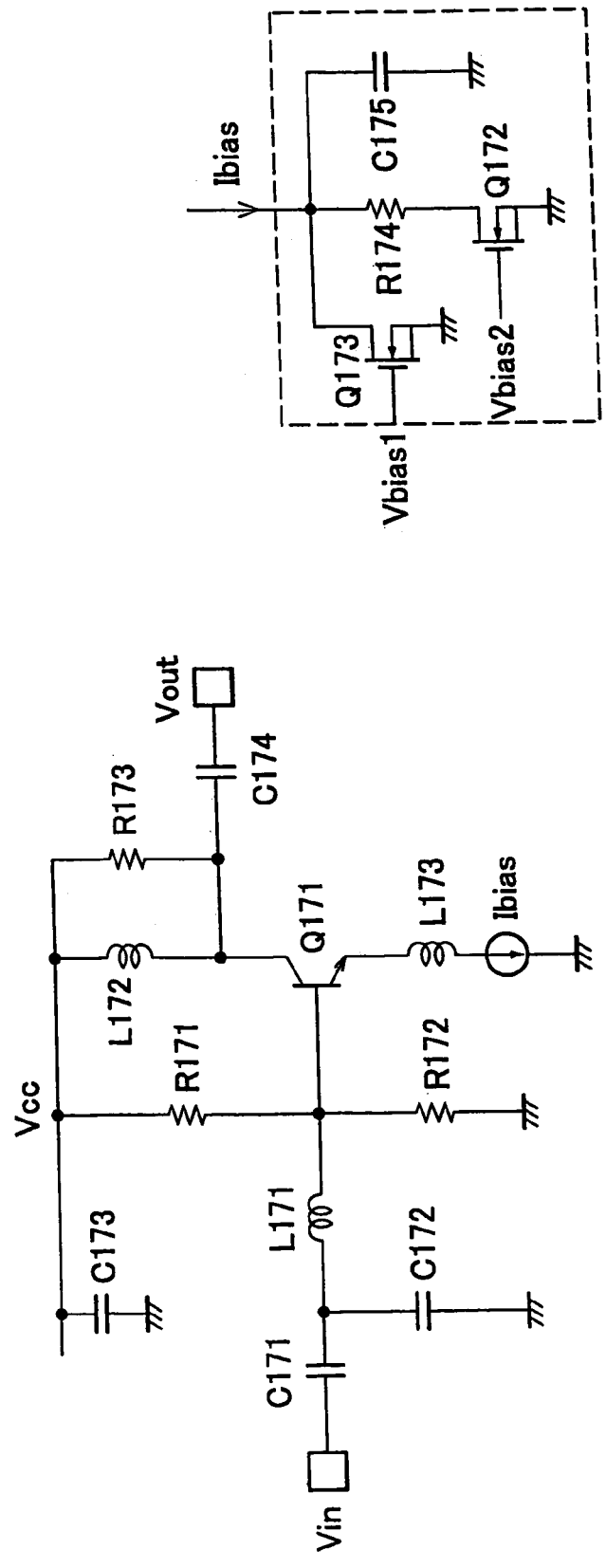
FIG. 17 is a circuit diagram illustrating the structure of a seventh conventional circuit.

Referring to FIG. 10, the variable gain amplifier circuit 1b includes amplifiers A1, A2, and A3. The three amplifiers are controlled through Vgain and have different gains from one another. The inputs of the amplifiers are connected to the signal output ends of the inductors L1, L2, and L3 respectively. In the transformer T, the inductors L1 and L2 are magnetically coupled together by a mutual inductance M12. The inductors L2 and L3 are magnetically coupled together by a mutual inductance 23. The inductors L1 and L3 are magnetically coupled together by a mutual inductance M13.

Configured from these amplifiers A1, A2, and A3 with differing gains, the variable gain amplifier circuit 1b provides a wider range of gains with more selectable values.

In the variable gain amplifier circuit 1, the amplifier A1, the amplifier A2, or both may be individually gain variable. This configuration enables the variable gain amplifier circuit 1 to provide a wider range of gains. Further, the amplifier A2 may have a gain less than 1.

In the variable gain amplifier circuit 1, either the amplifier A1 or the amplifier A2 may stop operating, while the other is in operation. In this configuration, one of the amplifier operates to amplify the incoming input signal Vin in the variable gain amplifier circuit 1, whereas the other amplifier does not operate. The variable gain amplifier circuit 1 consumes less power for operation.

The variable gain amplifier circuit 1 is by no means limited to bipolar transistor-based configurations. The circuit 1 may be configured from a gallium arsenide-based HBT (heterojunction bipolar transistor), an MESFET (metal semiconductor field effect transistor), or a silicon-based MOSFET (metal oxide semiconductor field effect transistor), to name a few examples.

In the variable gain amplifier circuit 1, the transformer T may take any configuration so long as the transformer T operates at frequencies at which the circuit is expected to operate. If the circuit 1 is designed to operate at frequencies as low as a few kilohertz for example, the transformer T is preferably designed with an iron core. On the other hand, if the circuit 1 is designed to operate in a high frequency band beyond 1 gigahertz (for example, 1 to 30 GHz), the transformer T is preferably designed with no iron core so that it primarily depends on the current for operation.

As described in the foregoing, the present invention is suitable for applications in wireless communications devices and other any signal processing device which is expected to amplify signals with low noise.

While the above description contains many specificities, these should not be construed as limitations on the scope of the invention, but rather as exemplifications of preferred embodiments thereof. Many other variations are possible. Accordingly, the scope of the invention should be determined not by the embodiments illustrated, but by the appended claims and their legal equivalents.

The inductor L2 may be connected at an end to a fixed electrical potential (e.g. ground).

In the variable gain amplifier circuit in accordance with the present invention, it is preferable if: the second amplifier includes: a first transistor determining the gain of the second amplifier; and a second transistor having identical characteristics as the first transistor, but making no contribution to the gain of the second amplifier; when an input signal is amplified by the first amplifier, the second transistor is on, and the first transistor is off; when the input signal is amplified by the second amplifier, the first transistor is on, and the second transistor is off.

According to the configuration, in the circuit, the second inductor in the transformer is always connected to one of the ON transistors sharing the same characteristics, no matter whether the first or second amplifier amplifies the input signal. The connection results in always rendering constant the ratio of the current flow through the first inductor to the current flow through the second inductor, no matter which signal path is taken by the input signal. The circuit input impedance is therefore always constant.

In the variable gain amplifier circuit in accordance with the present invention, it is preferable if the transformer configured from the first and second inductors is used for impedance matching with a signal source.

According to the configuration, in the circuit, the transformer is used for impedance matching with the signal source. For example, the circuit input impedance and the signal source impedance are matched by setting up the transformer so that the characteristics of the transformer match those of the signal source. This enables the signal to transfer a maximum power to the circuit.

In the variable gain amplifier circuit in accordance with the present invention, it is preferable if a magnetic coupling coefficient of the first and second inductors is varied to adjust a gain of the entire circuit.

According to the configuration, in the circuit, for example, various materials may be tested for the first and second inductors to obtain different magnetic coupling coefficients and hence different total circuit gains. Therefore, the gain is readily adjusted.

In the variable gain amplifier circuit in accordance with the present invention, it is preferable if a winding direction of either the first or second inductor is reversed to invert a signal polarity of an output signal.

According to the configuration, in the circuit, the winding direction of either the first or second inductor is reversed to invert the signal polarity of the output signal. No matter what electrical characteristics the amplifier amplifying the input signal has, the signal remains unchanged in polarity and appears as an output with the same polarity, for any of the signal paths.

In the variable gain amplifier circuit in accordance with the present invention, it is preferable if either one of the first and second amplifiers stops operating, while the other is in operation.

According to the configuration, when the input signal is amplified in the circuit, either one of the amplifiers operate, while the other amplifier does not. The circuit consumes less power for operation.

The variable gain amplifier circuit in accordance with the present invention further includes a preceding stage circuit between an end of the first inductor and the circuit input section to perform impedance matching.

According to the configuration, in the circuit, the input signal must go through the preceding stage circuit before feeing the first amplifier or the second amplifier. The preceding stage circuit thereby determines the input impedance of the entire circuit. Impedance matching with the signal source is readily performed.

As described in the foregoing, the variable gain amplifier circuit in accordance with the present invention includes: a first amplifier, having a predetermined gain, connected at a terminal to a circuit output section; a second amplifier, having a different gain from the first amplifier, connected at a terminal to the circuit output section; a first inductor connected at an end to a circuit input section and at another end to another terminal of the first amplifier; and a second inductor connected at an end to ground and at another end to another terminal of the second amplifier, the first inductor and the second inductor forming a transformer. The circuit restricts input impedance variations which are dependent on the signal path taken by the input signal. Impedance matching with the signal source is readily preformed.

The invention being thus described, it will be obvious that the same way may be varied in many ways. Such variations are not to be regarded as a departure from the spirit and scope of the invention, and all such modifications as would be obvious to one skilled in the art are intended to be included within the scope of the following claims.

What is claimed is:

1. A variable gain amplifier circuit, comprising:
   a first amplifier, having a predetermined gain, connected at a terminal to a circuit output section;
   a second amplifier, having a different gain from the first amplifier, connected at a terminal to the circuit output section;
   a first inductor connected at an end to a circuit input section and at another end to the input terminal of the first amplifier; and
   a second inductor connected at an end to a fixed electrical potential and at another end to the input terminal of the second amplifier, the first inductor and the second inductor forming a transformer.

2. The variable gain amplifier circuit according to claim 1, wherein:
   the second amplifier includes: a first transistor determining the gain of the second amplifier; and a second transistor having identical characteristics as the first transistor, but making no contribution to the gain of the second amplifier;
   when an input signal is amplified by the first amplifier, the second transistor is on, and the first transistor is off;
   when the input signal is amplified by the second amplifier, the first transistor is on, and the second transistor is off.

3. The variable gain amplifier circuit according to claim 1, wherein the transformer configured from the first and second inductors is used for impedance matching with a signal source.

4. The variable gain amplifier circuit according to claim 1, wherein a magnetic coupling coefficient of the first and second inductors is varied to adjust a gain of the entire circuit.

5. The variable gain amplifier circuit according to claim 1, wherein a winding direction of either the first or second inductor is reversed to invert a signal polarity of an output signal.

6. The variable gain amplifier circuit according to claim 1, wherein either one of the first and second amplifiers stops operating, while the other is in operation.

7. The variable gain amplifier circuit according to claim 1, further comprising a preceding stage circuit between an end of the first inductor and the circuit input section to perform impedance matching.

8. The variable gain amplifier circuit according to claim 1, wherein the transformer has a planar structure.

9. The variable gain amplifier circuit according to claim 1, wherein the gain of the first amplifier is greater than the gain of the second amplifier.

10. The variable gain amplifier circuit according to claim 1, wherein amplification paths are switched in accordance with an amplitude of the input signal for the input signal to pass therethrough.

11. The variable gain amplifier circuit according to claim 1, wherein either one or both of the first and second amplifiers are individually gain variable.

* * * * *